(12) United States Patent
Touzelbaev et al.

(10) Patent No.: US 7,678,615 B2
(45) Date of Patent: Mar. 16, 2010

(54) SEMICONDUCTOR DEVICE WITH GEL-TYPE THERMAL INTERFACE MATERIAL

(75) Inventors: Maxat Touzelbaev, San Jose, CA (US); Raj Master, San Jose, CA (US); Frank Kuechenmeister, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 183 days.

(21) Appl. No.: 11/846,618

(22) Filed: Aug. 29, 2007

(65) Prior Publication Data

US 2009/0057877 A1 Mar. 5, 2009

(51) Int. Cl.
| H01L 21/50 | (2006.01) |
| H01L 21/48 | (2006.01) |
| H01L 21/44 | (2006.01) |
| H01L 23/34 | (2006.01) |
| H01L 23/10 | (2006.01) |
| H01L 23/12 | (2006.01) |

(52) U.S. Cl. .................. 438/122; 438/121; 438/118; 257/706; 257/704; 257/E23.08

(58) Field of Classification Search ........... 438/121, 438/122, 118; 257/704, 706, E23.08
See application file for complete search history.

(56) References Cited

U.S. PATENT DOCUMENTS

| 4,564,562 | A | 1/1986 | Wong |
| 5,672,548 | A | 9/1997 | Culnane et al. |
| 6,617,683 | B2 * | 9/2003 | Lebonheur et al. .......... 257/707 |
| 6,650,019 | B2 | 11/2003 | Glenn et al. |
| 6,706,562 | B2 * | 3/2004 | Mahajan et al. ............. 438/125 |
| 7,013,965 | B2 * | 3/2006 | Zhong et al. ................ 165/185 |
| 7,362,580 | B2 * | 4/2008 | Hua et al. ................... 361/709 |
| 7,405,247 | B2 | 7/2008 | Sachdev et al. |
| 7,489,033 | B2 * | 2/2009 | Hua et al. ................... 257/704 |
| 2007/0151416 | A1 * | 7/2007 | Cheng et al. ................. 75/252 |

OTHER PUBLICATIONS

USPTO Office Action mailed Aug. 20, 2009; U.S. Appl. No. 11/856,033.

* cited by examiner

Primary Examiner—Luan C Thai
(74) Attorney, Agent, or Firm—Timothy M. Honeycutt

(57) ABSTRACT

Various methods and apparatus for establishing a thermal pathway for a semiconductor device are disclosed. In one aspect, a method of manufacturing is provided that includes forming a metal layer on a semiconductor chip and forming a gel-type thermal interface material layer on the metal layer. A solvent and a catalyst material are applied to the metal layer prior to forming the gel-type thermal interface material layer to facilitate bonding between the gel-type thermal interface material layer and the metal layer.

27 Claims, 5 Drawing Sheets

SEMICONDUCTOR DEVICE WITH GEL-TYPE THERMAL INTERFACE MATERIAL

BACKGROUND OF THE INVENTION

1. Field of the Invention

This invention relates generally to semiconductor processing, and more particularly to apparatus and methods for packaging a semiconductor chip with a thermal interface material.

2. Description of the Related Art

Many current integrated circuits are formed as multiple die on a common wafer. After the basic process steps to form the circuits on the die are complete, the individual die are cut from the wafer. The cut die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder bumps are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material ideally fully contacts both the upper surface of the integrated circuit and the portion of the lower surface of the lid that overlies the integrated circuit. Conventional thermal interface materials include various types of pastes, and in some cases, a metal. Gel-type thermal interface materials consist of a polymeric matrix interspersed with thermally conductive particles, such as aluminum. More recently, designers have begun to turn to indium as a thermal interface material, particularly for high power-high temperature chips.

A metal thermal interface material like indium has favorable thermal properties that work well for high power-high temperature die. However, indium exhibits relatively poor adhesion to silicon. To facilitate bonding with indium, the backside of a silicon die may be provided with a metallization stack that includes a layer that readily adheres to silicon, a layer that readily wets indium and perhaps one or more intermediary barrier or other layers. An entire wafer of dice may be provided with respective metallization stacks en masse prior to dicing.

Not all dice on a given wafer clock natively at the same speed. Those chips that natively clock higher may be selected for high performance applications and markets. Those chips that natively clock out at slower speeds may still be quite useful in less intensive computing environments where the thermal environment is correspondingly less hostile. For the slower chips, a metal thermal interface material may not be necessary to carry the thermal load and may even be carry an economic penalty. In such circumstances, it may be desirable to use a gel-type thermal interface material.

Unfortunately, gel-type thermal interface materials do not adhere well with at least one conventional design for a backside metallization stack that uses a gold film as the top-most layer. Inevitable flexure of the die and package substrate can stretch the thermal interface material and cause delamination where there is poor adhesion with the gold film. Delamination causes the thermal resistance of the pathway from the chip to the lid to climb, perhaps to the point of thermal shutdown.

A conventional gel-type thermal interface material contains a small initial concentration of platinum that is designed to acts as a catalyst to improve bonding between a conventional gold film and the thermal interface material. The platinum particles are mixed into the gel prior to application to the gold film. Through mechanisms that are not well understood, the catalytic properties become poisoned by the gold film. Less than optimal bonding may occur and the risk of delamination remains.

The present invention is directed to overcoming or reducing the effects of one or more of the foregoing disadvantages.

SUMMARY OF THE INVENTION

In accordance with one aspect of the present invention, a method of manufacturing is provided that includes forming a metal layer on a semiconductor chip and forming a gel-type thermal interface material layer on the metal layer. A catalyst is used to facilitate bonding between the gel-type thermal interface material layer and the metal layer.

In accordance with another aspect of the present invention, a method of manufacturing is provided that includes forming a metal layer on a semiconductor chip. The metal layer includes a catalyst. A gel-type thermal interface material layer is formed on the metal layer. The gel-type thermal interface material layer is cured. The catalyst facilitates bonding between the gel-type thermal interface material layer and the metal layer.

In accordance with another aspect of the present invention, an apparatus is provided that includes a semiconductor chip that has a metal layer and a gel-type thermal interface material layer on the metal layer. The metal layer includes a catalyst to facilitate bonding between the gel-type thermal interface material layer and the metal layer.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
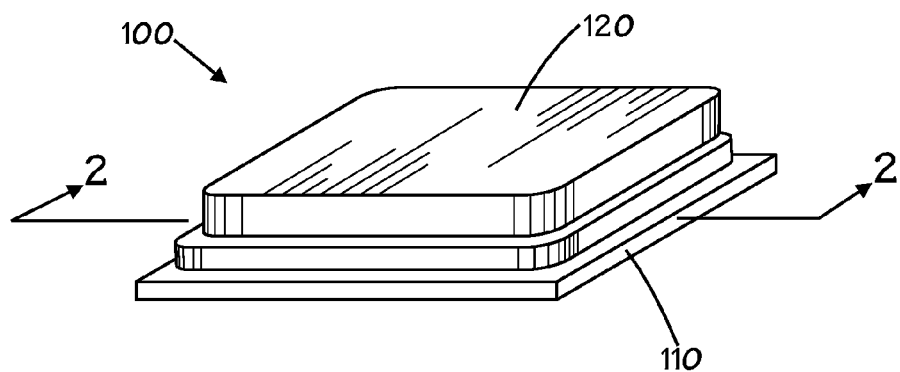
FIG. 1 is a pictorial view of an exemplary embodiment of a semiconductor device package.

In the drawings described below, reference numerals are generally repeated where identical elements appear in more than one figure. Turning now to the drawings, and in particular to FIG. 1, therein is shown a pictorial view of an exemplary embodiment of a semiconductor device package 100 that includes a base substrate 110 and a lid 120 positioned thereon. Together, the substrate 110 and the lid 120 enclose an integrated circuit that is not visible in FIG. 1 but is shown in subsequent figures. The lid 120 is depicted as a top hat design, although virtually any type of lid may be suitably used with the package 100.

Figure 2:
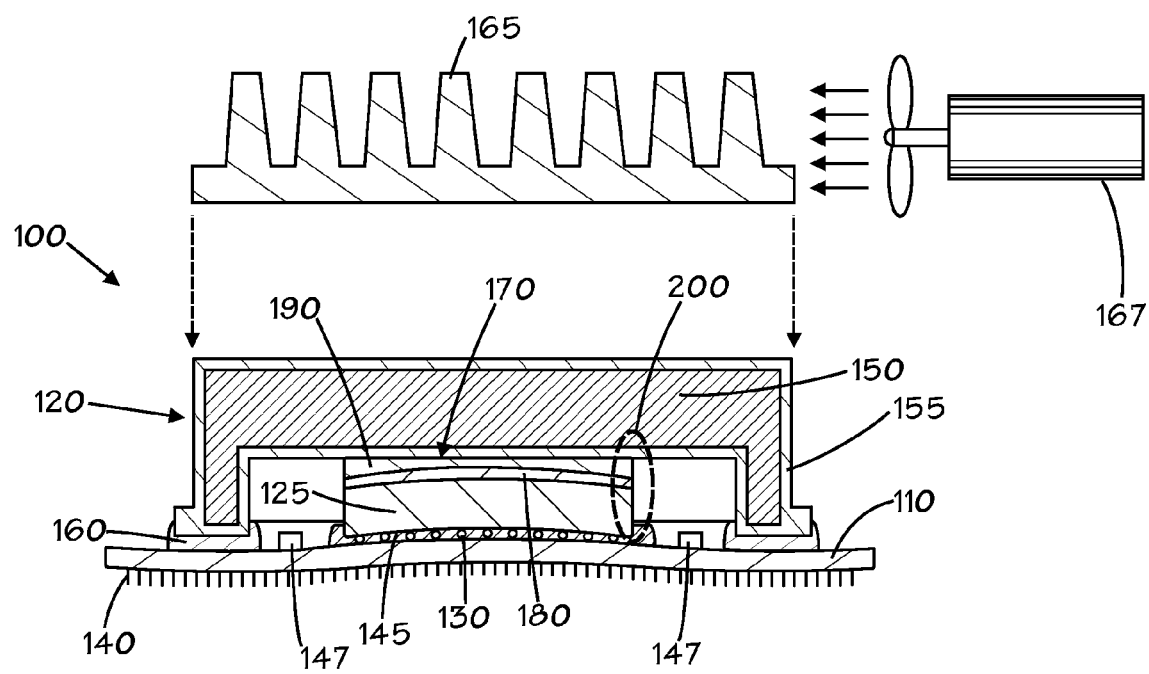
FIG. 2 is a sectional view of FIG. 1 taken at section 2-2.

Additional detail of the package 100 may be understood by referring now also to FIG. 2, which is a sectional view of FIG. 1 taken at section 2-2. An integrated circuit 125, which may be a semiconductor device, chip or other type of device as desired is mounted on the base substrate 110. The integrated circuit 125 may be any of a myriad of different types of circuit devices used in electronics, such as, for example, microprocessors, graphics processors, application specific integrated circuits, memory devices or the like, and may be single or multi-core. The semiconductor device 125 may be composed of silicon, germanium or the like and may be bulk semiconductor or semiconductor-on-insulator. The semiconductor device 125 is shown flip-chip mounted to the substrate 110 and electrically interconnected therewith by way of a plurality of conductor structures 130 which are depicted as small white circles. The conductor structures 130 may be solder bumps or balls, conductive pillars of copper or other conductive materials used with or without solder or the like.

The substrate 110 may interconnect electrically with external devices, such as another circuit board, in a variety of ways. In the exemplary embodiment, a pin grid array consisting of a plurality of conductor pins 140 projects from the substrate 110. The substrate 110 includes electrical interconnects that are not visible but are present to establish electrical connectivity between the array of pins 140 and the conductor structures 130. Optionally, a ball grid array, a land grid array or some other type of interconnect configuration may be used. The substrate 110 may be formed from polymeric materials, ceramic materials or the like. The substrate 110 may actually consist of multiple layers of metallization and dielectric materials that electrically interconnect the conductor pins 140 to various portions of the integrated circuit 125 by way of the conductors 130. The number of individual layers is largely a matter of design discretion. In certain exemplary embodiments, the number of layers may vary from four to sixteen. If such a build-up design is selected, a standard core, thin core or coreless arrangement may be used. The dielectric materials may be, for example, epoxy resin with or without fiberglass fill.

An underfill material 145 is positioned between the semiconductor device 125 and the substrate to cushion and address issues of differing coefficients of thermal expansion for the substrate 110 and the semiconductor device 125. The underfill material 145 may be composed of well-known epoxy materials, such as epoxy resin with or without silica fillers and phenol resins or the like.

The substrate 110 may be provided with plural passive devices 147, such as capacitors, inductors and resistors, to facilitate the operation of the semiconductor device 125. The passive devices 147 may be on, in or below the substrate 110 or some combination of those positions.

The lid 120 may be composed of well-known plastics, ceramics or metallic materials as desired. Some exemplary materials include nickel plated copper, anodized aluminum, aluminum-silicon-carbon, aluminum nitride, boron nitride or the like. In an exemplary embodiment, the lid 120 may consist of a copper core 150 surrounded by a nickel jacket 155. Optionally, the lid 110 may be other than a bathtub configuration. Indeed, a heat spreader other than a lid may be used. For example the substrate 110 may be a circuit board or card and the semiconductor device 125 may be mounted thereon without a lid but with a heat sink.

An adhesive bead 160 is positioned on the base substrate 110 in order to secure the lid 120. The adhesive 160 has a general outline that tracks the shape of the perimeter of the overlying lid 120. The adhesive 160 may be a continuous bead or a series of segments as desired. The adhesive 160 may be composed of well-known epoxies or other types of adhesives.

One of the principal purposes of the lid 120 is to transfer heat away from the semiconductor device 125. Thus, an optional external heat sink 165 with or without fluid cooling may be seated on the lid 120 and used in conjunction with a fan 167. Furthermore, it is desirable to provide a low thermal resistance pathway between a lower surface 170 of the lid 120 and the semiconductor device 125. The pathway may consist of a backside metallization layer 180 formed on the semiconductor device 125 and a thermal interface material layer 190 sandwiched between the backside metallization layer 180 and the underside 170 of the lid 120. The backside metallization layer 180 may consist of a stack of materials that facilitate bonding between the lid 120 and the thermal interface material 190. The materials suitable for the stack 180 will generally depend on the type of thermal interface material 190 and the composition of the semiconductor device 125. Metallic thermal interface materials, such as indium or gallium, have good thermal properties that make them desirable for high temperature-high power circuits. However, such metals require a contact surface of gold, gallium or the like to readily wet during reflow. Accordingly, the top layer of the stack 180 may be gold, palladium or the like. Aluminum adheres well to silicon and thus is often selected as the first layer of the stack 180 formed on the semiconductor device 125. To prevent diffusion of metal into the semiconductor device 125, a barrier layer of, for example, titanium is formed on the aluminum layer. Finally, to facilitate adhesion with the gold top layer, a layer of material that adheres to both titanium and gold is used. An example is a mixture of vanadium and nickel.

The thermal interface material 190 is advantageously composed of metallic materials, such as indium, gallium or the like, or polymeric materials such as, for example, silicone rubber mixed with aluminum particles and zinc oxide. Optionally, compliant base materials other than silicone rubber and thermally conductive particles other than aluminum may be used. Such polymeric materials may be termed "gel-type" materials. As noted in the Background section hereof, it may be desirable to use a "gel-type" in conjunction with a semiconductor device 125 fitted with a backside metallization stack. Where gold or the like is used as the top layer of the stack, delamination of the gel-type thermal interface material can occur due to thermal stresses and poor adhesion to the gold film.

The embodiments disclosed herein alleviate the problems of gel-type thermal interface material adhesion. Assume for the purposes of illustration that the thermal interface material 190 is a gel-type and the top layer of the metallization stack 180 is gold. Following the curing of the underfill material 145, the adhesive 160, and the thermal interface material 190 if that material requires a cure, there may be a warping of the substrate 110 that produces the somewhat recurve profile depicted in FIG. 2. The amount of warpage is dependent on the temperature of the package 100. FIG. 2 depicts a typical amount of warpage at around room temperature. However, as the temperature of the package 100 rises to over about room temperature to 150° C., the substrate 100 tends to flatten. This produces an attendant flattening of the semiconductor device 125 and a stretching of the thermal interface material 190. If there is poor adhesion between the thermal interface material 190 and the metallization stack 180, the stretching may produce delamination and correspondingly poor heat transfer.

Figure 3:
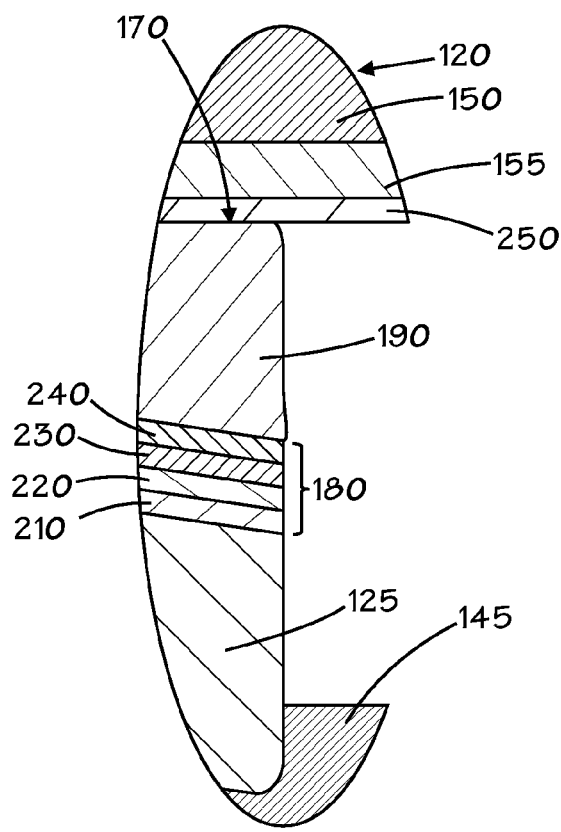
FIG. 3 is a magnified view of a portion of FIG. 2.

Portions of the semiconductor device package 100 circumscribed by the dashed oval 200 in FIG. 2 are shown at greater magnification in FIG. 3. Because of the shape and position of the dashed oval 200 in FIG. 2, FIG. 3 depicts a small portion of the underfill material 145, the semiconductor device 125, the thermal interface material 190, and the metal jacket 155 and core 150 of the lid 120. In addition, the backside metallization stack 180 is shown. As noted above, the backside metallization layer 180 may actually be configured as a laminate structure. In this regard, and in this illustrative embodiment, the back side metallization layer may consist of an aluminum film 210 positioned on the semiconductor device 125, a titanium layer 220 positioned on the aluminum layer 210, a nickel-vanadium layer 230 positioned on the titanium layer 220 and a gold layer 240 positioned on the nickel-vanadium layer 230. An optional wetting film 250 may also be provided in between the metal jacket 155 of the lid 120 and the thermal interface material 190. The film 250 may be composed of gold or whatever material may be appropriate for wetting the particular thermal interface material.

The present illustrative embodiment solves the problem of poor adhesion of a gel-type thermal interface material 190 and the gold film 240 by incorporating a catalyst material either into the layers 240 (and the layer 300 if present and desired) directly or by the usage of a topically applied solvent that includes a catalyst material. The usage of the catalyst enables a favorable adhesion between the gel-type interface material 190 and the underlying gold film 240.

Figure 4:
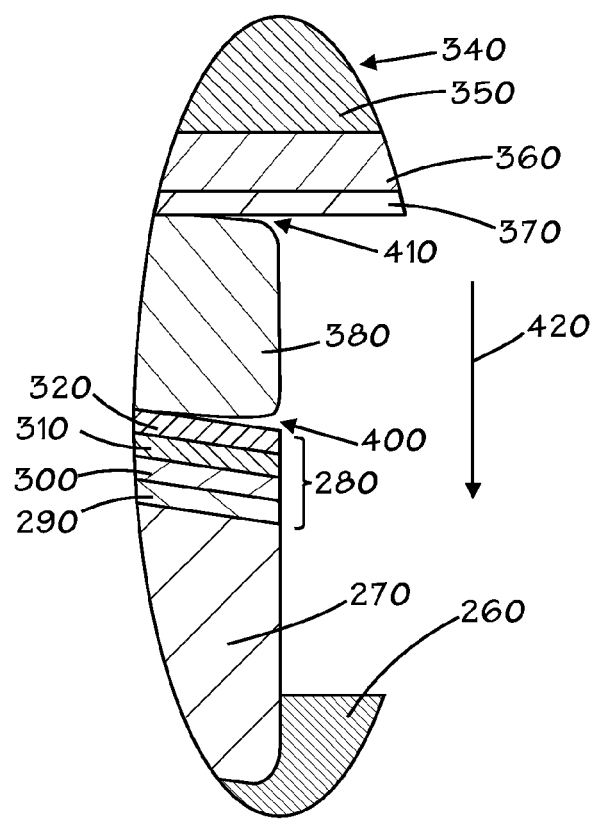
FIG. 4 is a sectional view like FIG. 3 but of a conventional semiconductor device.
Figure 5:
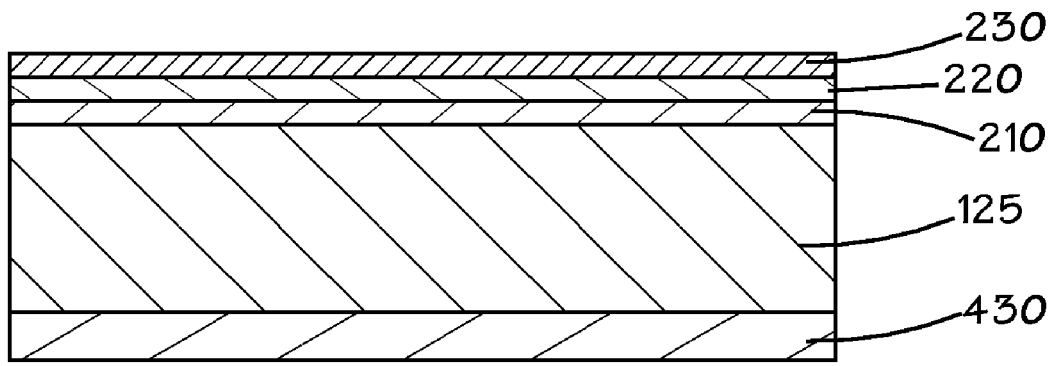
FIG. 5 is a sectional view depicting an exemplary method of forming portions of a metallization stack on a semiconductor device.

This favorable adhesion should be contrasted with the problems associated with a conventional non-metallic thermal interface material used in conjunction with a gold underlayer. Such a conventional configuration is depicted in FIG. 4, which shows the same general magnified portion that is represented in FIG. 3 albeit for a conventional device. In this regard, an underfill material layer 260 is positioned beneath a semiconductor device 270. A back side metallization stack 280 is positioned on the semiconductor device 270. The stack 280 consists of an aluminum film 290, titanium film 300, a nickel-vanadium film 310 and top film 320 of gold. A lid 340 consisting of a metal core 350, a metal jacket 360 and a gold wetting film 370 is present. A conventional gel-type thermal interface material 380 is interposed between the gold film 370 and the gold film 320 of the stack 280. As a result of the poor adhesion between the conventional thermal interface material 380 and the conventional gold film 320, and the force 420 due to the aforementioned flattening of the semiconductor device 270 (due to substrate flattening), the thermal interface material 380 has undergone significant delamination in the regions 400 and 410. The delaminated regions 400 and 410 raise the thermal resistance of the arrangement. As described generally in the Background section hereof, the gold in the film 320 appears to exhibit some poisoning of the native concentration of platinum catalyst present in the conventional thermal interface material 380.

An exemplary process flow for fabricating the semiconductor package 100 depicted in FIGS. 1 and 2 may be understood by referring now to FIGS. 5, 6, 7 and 8. Attention is turned initially to FIG. 5, which is a sectional view of the semiconductor device 125. The semiconductor device 125 may be provided with a polymer layer 430, composed of polyimide or other polymeric material that serves as a stress relieving cushion for the subsequent flip-chip mounting of the semiconductor device 125 to the substrate 110 depicted in FIGS. 1 and 2. The aluminum film 210 may be formed on the device 190 by physical vapor deposition or other well-known techniques. The titanium layer 220 may be formed on the aluminum layer 210 and the nickel-vanadium layer 230 on the titanium layer 220 by physical vapor deposition or other well-known techniques. The semiconductor device 125 is now ready to receive the gold film 240 and the catalytic material. It should be understood that the films 210, 220, 230, 240 and 430 may be formed on the semiconductor device on an individual basis, or collectively on multiple devices 125 that are part of some larger structure, such as a wafer.

Figure 6:
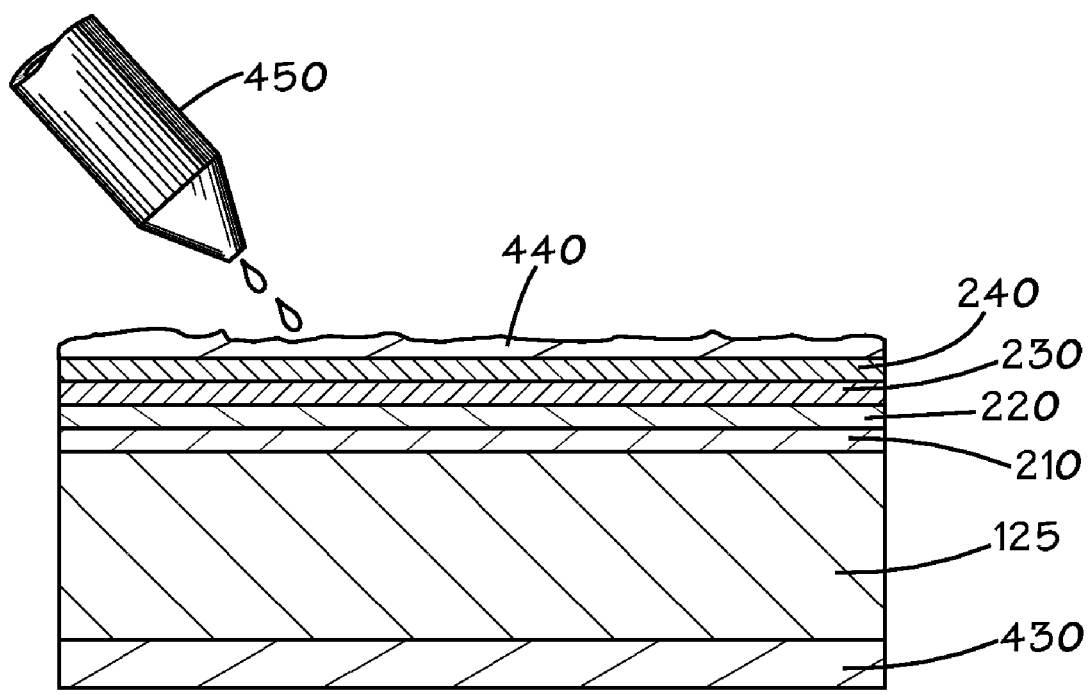
FIG. 6 is a sectional view like FIG. 5 depicting formation of a metal layer and catalyst deposition thereon.

As shown in FIG. 6, the gold film 240 may be formed on the nickel-vanadium layer 230 by sputtering, e.g., physical vapor deposition or other well-known techniques. In this illustrative embodiment, a solvent 440 may be applied to the gold film 240. An applicator 450 may be used to deposit the catalyst solvent 440. The purpose of the catalyst material 440 is to facilitate the bonding of the gold film 240 to a gel-type thermal interface material. Exemplary materials for the catalytic material include platinum mixed with an organic solvent, such as acetone, toluene, isopropyl alcohol or other types of alcohols.

Figure 7:
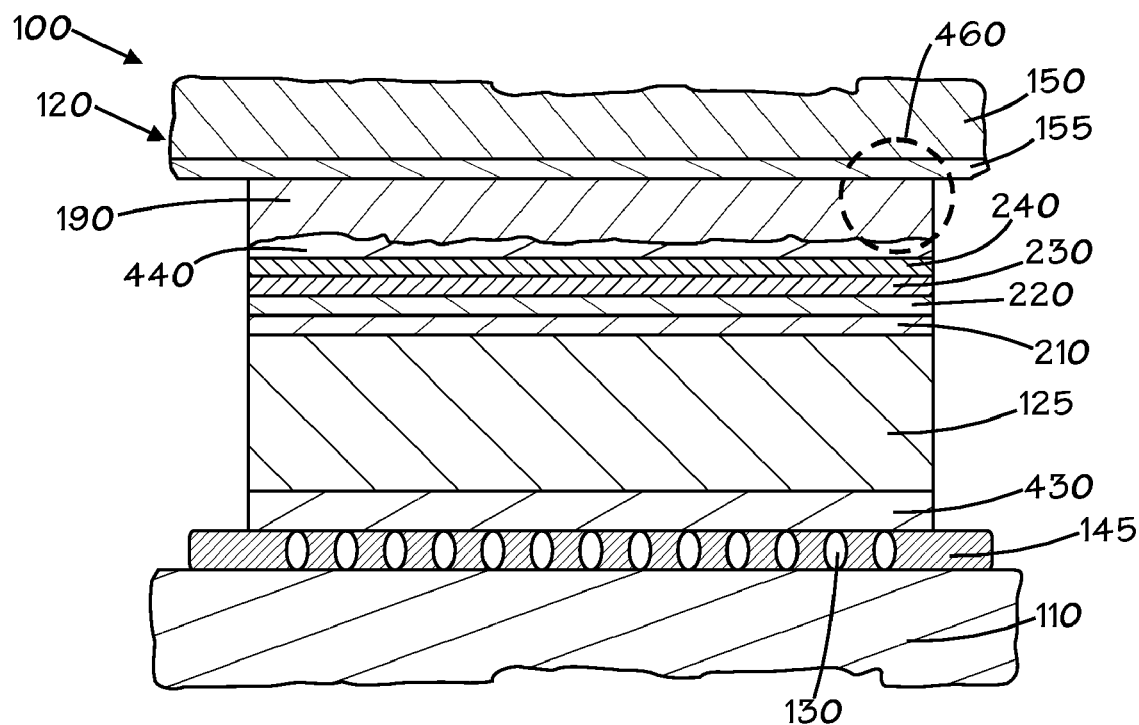
FIG. 7 is a sectional view of an exemplary mounting of the semiconductor device to a substrate and heat spreader.

Attention is now turned to FIG. 7, which is a sectional view depicting the semiconductor device package 100 with semiconductor device 125 flip-chip mounted on the substrate 110 and the lid 120 seated. Note that only portions of the substrate 110 and lid 120 are depicted. The underfill material 145, conductor structures 130 and polymer layer 430 are visible. Prior to seating the lid 120 and with the catalytic solvent 440 in place, the gel-type thermal interface material 190 is applied. The lid 120 is seated and the gel-type thermal interface material 190 is subjected to a thermal cure. In an exemplary embodiment, the thermal cure may be performed at about 110 to 130° C. for about 30 to 120 minutes. Portions of the gold film 240, thermal interface material 190, the solvent layer 440 and the overlying metal jacket 155 and the metal core 150 of the lid 120 circumscribed by a dashed circle 460 are shown at greater magnification in FIG. 8.

Figure 8:
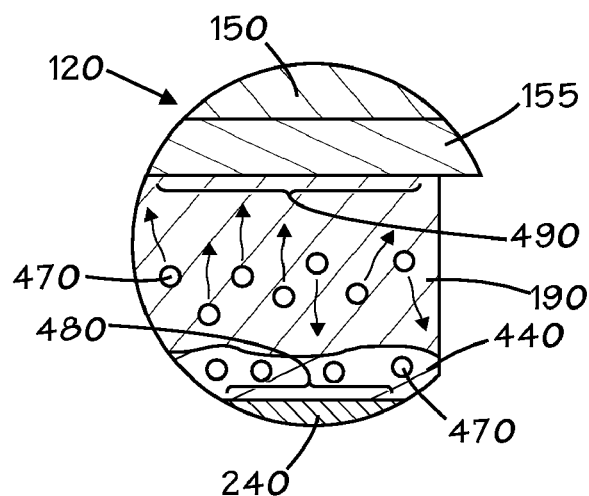
FIG. 8 is a magnified portion of FIG. 7.

Attention is now turned to FIG. 8. During the thermal cure, particles of catalyst, represented by the small circles 470 of the solvent layer 440 may migrate somewhat upward from the solvent layer 440 into the thermal interface material 240. Even if there is no significant upward migration, the presence of the catalyst particles 450 facilitates the bonding at the interface 480 between the thermal interface material 190 and the underlying gold film 240. If a gold film were interposed in the region 490 between the thermal interface material 190 and the lid jacket 155, then a corresponding solvent layer like the solvent layer 440 could be applied to the optional lid gold film and the same type of facilitated bonding could be achieved.

Figure 9:
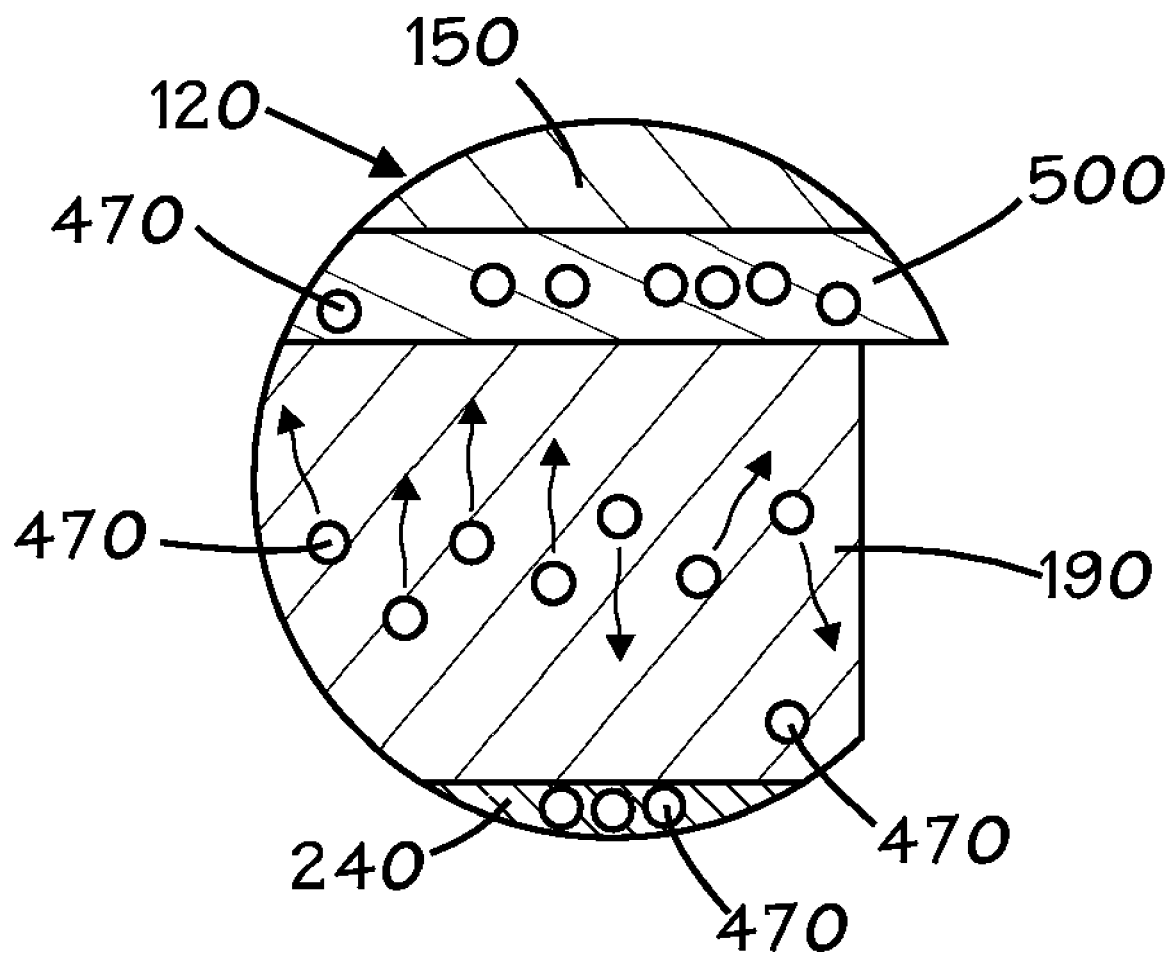
FIG. 9 is magnified view like FIG. 8 but of an alternate exemplary embodiment of a semiconductor device incorporating a catalyst.

In an alternate exemplary embodiment, the catalyst material may be introduced directly into the top-most layer of the back side metallization structure. In this regard, FIG. 9 depicts a magnified sectional view of the same portion depicted in FIG. 8. However, in this illustrative embodiment, the catalyst particles 470 are infused directly into the gold film 240 and an optional overlying gold film 500. The catalyst particles 470 may be introduced into the gold films 240 and 500 by a variety of techniques. In an exemplary embodiment, a catalyst material may be introduced into the sputtering stream or plating liquid used to deposit the gold films 240 and 500. During the subsequent thermal cure of the thermal interface material 190, the catalyst particles may migrate out of the gold films 240 and 500 somewhat into the thermal interface material 190. More significantly, the presence of the catalyst materials 470 in the layers 240 and 500 facilitate the bonding of the gel-type thermal interface material 190 to the gold layers 240 and 500. It is anticipated that a concentration of about 0.02 to 1% platinum by volume may be used for a solvent catalyst. For a directly introduced catalyst as depicted in FIG. 9, the concentration of catalyst in the sputtered material for the layers 290 and 480 may be about 0.5 to 20 molar % in an exemplary embodiment and about 1-3 molar % in another exemplary embodiment.

If desired, both techniques may be combined, that is, catalyst may be introduced directly into the metal layers during deposition and also applied to the metal layers in solvent form. This may be advantageous where maximum coverage is desired.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
   forming a metal layer on a semiconductor chip;
   applying a gel-type thermal interface material layer on the metal layer; and
   applying solvent and a catalyst material to the metal layer prior to applying the gel-type thermal interface material layer to facilitate bonding between the gel-type thermal interface material layer and the metal layer.

2. The method of claim 1, wherein the forming the metal layer comprises forming a gold layer.

3. The method of claim 1, wherein the applying the gel-type thermal interface material layer comprises applying a layer of silicone.

4. The method of claim 3, wherein the applying the gel-type thermal interface material layer comprises applying a layer of silicone containing aluminum and zinc oxide.

5. The method of claim 1, wherein the applying a solvent and a catalyst comprises applying a mixture of an alcohol and platinum.

6. The method of claim 1, comprising incorporating a catalyst into the metal layer prior to applying the gel-type thermal interface material layer.

7. The method of claim 1, comprising coupling the semiconductor chip to a substrate.

8. The method of claim 7, comprising coupling a heat spreader to the semiconductor chip.

9. The method of claim 8, wherein the coupling the heat spreader comprises coupling a lid to the semiconductor chip.

10. A method of manufacturing, comprising:
    forming a metal layer on a semiconductor chip, the metal layer including a catalyst;
    applying a gel-type thermal interface material layer on the metal layer; and
    curing the gel-type thermal interface material layer, the catalyst facilitating bonding between the gel-type thermal interface material layer and the metal layer.

11. The method of claim 10, wherein the forming the metal layer comprises sputtering.

12. The method of claim 10, wherein the forming the metal layer comprises sputtering a stream of gold, and a platinum catalyst.

13. The method of claim 10, wherein the applying the gel-type thermal interface material layer comprises forming a layer of silicone.

14. The method of claim 13, wherein the applying the gel-type thermal interface material layer comprises applying a layer of silicone containing aluminum and zinc oxide.

15. The method of claim 10, comprising coupling the semiconductor chip to a substrate.

16. The method of claim 15, comprising coupling a heat spreader to the semiconductor chip.

17. The method of claim 16, wherein the coupling the heat spreader comprises coupling a lid to the semiconductor chip.

18. An apparatus, comprising:
    a semiconductor chip having a metal layer;
    a gel-type thermal interface material layer on the metal layer; and
    whereby the metal layer includes a catalyst to facilitate bonding between the gel-type thermal interface material layer and the metal layer.

19. The apparatus of claim 18, wherein the metal layer comprises a gold layer.

20. The apparatus of claim 18, wherein the gel-type thermal interface material layer comprises a layer of silicone.

21. The apparatus of claim 20, wherein the gel-type thermal interface material layer comprises a layer of silicone containing aluminum and zinc oxide.

22. The apparatus of claim 18, comprising a solvent and a catalyst material positioned between the metal layer and the gel-type thermal interface material layer.

23. The apparatus of claim 22, wherein the solvent comprises an alcohol and the catalyst comprises platinum.

24. The apparatus of claim 18, wherein the catalyst comprises platinum.

25. The apparatus of claim 18, comprising a substrate coupled to the semiconductor chip.

26. The apparatus of claim 25, comprising a heat spreader coupled to the semiconductor chip.

27. The apparatus of claim 26, wherein the heat spreader comprises a lid.

* * * * *